US009897655B2

(12) United States Patent
Park et al.

(10) Patent No.: US 9,897,655 B2
(45) Date of Patent: Feb. 20, 2018

(54) SCAN CHAIN CIRCUIT AND INTEGRATED CIRCUIT INCLUDING THE SAME

(71) Applicant: SAMSUNG ELECTRONICS CO., LTD., Suwon-si (KR)

(72) Inventors: In-Gyu Park, Seoul (KR); Dong-Wook Seo, Hwaseong-si (KR); Chan-Ho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 364 days.

(21) Appl. No.: 14/706,224

(22) Filed: May 7, 2015

(65) Prior Publication Data
US 2016/0003901 A1  Jan. 7, 2016

(30) Foreign Application Priority Data
Jul. 7, 2014  (KR) .................. 10-2014-0084397

(51) Int. Cl.
*G01R 31/3185*  (2006.01)
*H03K 3/037*  (2006.01)

(52) U.S. Cl.
CPC ........... *G01R 31/318538* (2013.01); *G01R 31/318555* (2013.01); *H03K 3/0375* (2013.01)

(58) Field of Classification Search
CPC ............. H03K 3/0372; H03K 3/0375; G01R 31/318536–31/318541; G01R 31/318552; G01R 31/318555; G11C 19/28
See application file for complete search history.

(56) References Cited

U.S. PATENT DOCUMENTS

| 6,064,246 A  | * | 5/2000 | Endo ...................... G11C 19/28 327/202 |
| 6,429,713 B2 |   | 8/2002 | Nakaizumi |
| 6,785,187 B2 |   | 8/2004 | Fujimoto et al. |
| 6,856,270 B1 | * | 2/2005 | Farmer ..................... G06F 5/08 341/161 |
| 7,243,279 B2 |   | 7/2007 | Anand et al. |
| 7,565,591 B2 |   | 7/2009 | Dingemanse |
| 7,859,918 B1 |   | 12/2010 | Nguyen et al. |
| 7,940,100 B2 | * | 5/2011 | Keskin .................. H03K 3/037 327/161 |
| 8,484,523 B2 |   | 7/2013 | Ramaraju et al. |
| 8,522,098 B2 |   | 8/2013 | Whetsel |
| 2004/0250185 A1 | | 12/2004 | Date |
| 2006/0282727 A1 | | 12/2006 | Hoshaku |
| 2008/0142606 A1 | | 6/2008 | Wu |
| 2011/0219160 A1 | | 9/2011 | Lambrache et al. |

FOREIGN PATENT DOCUMENTS

JP  2010-025903 A  2/2010

* cited by examiner

*Primary Examiner* — Patrick O'Neill
(74) *Attorney, Agent, or Firm* — Sughrue Mion, PLLC

(57) ABSTRACT

A scan chain circuit includes first through N-th flip-flops connected in series to sequentially transfer data in response to a control signal, where N is an integer greater than 1. In the first through N-th flip-flops, the data are transferred in a first direction from the first flip-flop to the N-th flip-flop. The control signal is applied to the first through N-th flip-flops in a second direction opposite to the first direction from the N-th flip-flop to the first flip-flop.

15 Claims, 11 Drawing Sheets

SCAN CHAIN CIRCUIT AND INTEGRATED CIRCUIT INCLUDING THE SAME

CROSS-REFERENCE TO THE RELATED APPLICATION

This U.S. non-provisional application claims priority from Korean Patent Application No. 10-2014-0084397 filed on Jul. 7, 2014 in the Korean Intellectual Property Office, the disclosure of which is incorporated herein in its entirety by reference.

BACKGROUND

1. Field

Apparatuses and methods consistent with exemplary embodiments of the inventive concept relate to semiconductor devices, and more particularly, to scan chain circuits and integrated circuits including scan chain circuits.

2. Description of the Related Art

A scan chain circuit includes a plurality of flip-flops that are coupled in series. In the scan chain circuit, an input terminal of each flip-flop is coupled to an output terminal of a previous flip-flop, and an output terminal of each flip-flop is coupled to an input terminal of a next flip-flop. The scan chain circuit is a design for test (DFT) circuit for efficiently testing a semiconductor device, such as an integrated circuit, and may be used in a scan test. Further, the scan chain circuit may be used in utilizing data sensed from an electrical fuse (e-fuse).

SUMMARY

Example embodiments of the inventive concept provide a scan chain circuit capable of preventing a timing fail.

Example embodiments of the inventive concept also provide an integrated circuit including a scan chain circuit capable of preventing a timing fail.

According to an example embodiment, there is provided a scan chain circuit which may include first through N-th flip-flops connected in series to sequentially transfer data in response to a control signal, where N is an integer greater than 1. In the first through N-th flip-flops, the data are transferred in a first direction from the first flip-flop to the N-th flip-flop, and the control signal is applied to the first through N-th flip-flops in a second direction opposite to the first direction from the N-th flip-flop to the first flip-flop.

The control signal applied to an (M−1)-th flip-flop of the first through N-th flip-flops may be delayed with respect to the control signal applied to an M-th flip-flop of the first through N-th flip-flops, where M is an integer greater than 1 and less than or equal to N.

The scan chain circuit may further include a delay circuit configured to delay the control signal applied to the (M−1)-th flip-flop such that the control signal applied to the (M−1)-th flip-flop is delayed with respect to the control signal applied to the M-th flip-flop.

The control signal may be a clock signal, and a clock propagation direction of the scan chain circuit may be the second direction opposite to the first direction in which the data are transferred.

The scan chain circuit may further include an input inverter configured to invert the control signal, and first through N-th inverters coupled to the first through N-th flip-flops, respectively, each of the first through N-th inverters being configured to invert the inverted control signal.

The scan chain circuit may further include first through (N−1)-th delay circuits each of which is coupled between input terminals of two adjacent inverters of the first through N-th inverters.

The first through N-th flip-flops may be grouped into first through L-th flip-flop groups, where L is an integer greater than 1 and less than or equal to N, and flip-flops in a same flip-flop group may substantially simultaneously receive the control signal.

The control signal applied to a (K−1)-th flip-flop group of the first through L-th flip-flop groups may be delayed with respect to the control signal applied to a K-th flip-flop group of the first through L-th flip-flop groups, where K is an integer greater than 1 and less than or equal to L.

The scan chain circuit may further include a delay circuit configured to delay the control signal applied to the (K−1)-th flip-flop group such that the control signal applied to the (K−1)-th flip-flop group is delayed with respect to the control signal applied to the K-th flip-flop group.

The scan chain circuit may further include an input inverter configured to invert the control signal, and first through L-th inverters coupled to the first through L-th flip-flop groups, respectively, each of the first through L-th inverters configured to invert the inverted control signal.

The scan chain circuit may further include first through (L−1)-th delay circuits each of which is coupled between input terminals of two adjacent inverters of the first through L-th inverters.

Each of the first through N-th flip-flops may include a first transmission gate configured to selectively transfer the data in response to the control signal, a first latch configured to store the data transferred by the first transmission gate, a second transmission gate configured to selectively transfer the data stored in the first latch in response to an inversion signal of the control signal, and a second latch configured to store the data transferred by the second transmission gate.

The first transmission gate may include a first n-channel metal-oxide-semiconductor field-effect transistor (NMOS) transistor coupled between an input terminal of a corresponding one of the first through N-th flip-flops and the first latch, the first NMOS transistor having a gate receiving the control signal, and a first p-channel metal-oxide-semiconductor field-effect transistor (PMOS) transistor coupled in parallel with the first NMOS transistor between the input terminal of the corresponding one of the first through N-th flip-flops and the first latch, the first PMOS transistor having a gate receiving the inversion signal of the control signal. The second transmission gate may include a second PMOS transistor coupled between the first latch and the second latch, the second PMOS transistor having a gate receiving the control signal, and a second NMOS transistor coupled in parallel with the second PMOS transistor between the first latch and the second latch, the second NMOS transistor having a gate receiving the inversion signal of the control signal.

The first latch may include a first inverter configured to invert the data transferred by the first transmission gate, a first logic gate having a first input terminal receiving an output signal of the first inverter, a second input terminal, and an output terminal coupled to an output terminal of the second transmission gate, and a second logic gate having a first input terminal receiving the data transferred by the first transmission gate, a second input terminal coupled to the output terminal of the first logic gate, and an output terminal coupled to the second input terminal of the first logic gate. The second latch may include a second inverter configured to invert the data transferred by the second transmission gate, a third logic gate having a first input terminal receiving an output signal of the second inverter, a second input terminal, and an output terminal coupled to an input terminal of a next one of the first through N-th flip-flops, and a fourth logic gate having a first input terminal receiving the data transferred by the second transmission gate, a second input terminal coupled to the output terminal of the third logic gate, and an output terminal coupled to the second input terminal of the third logic gate.

According to another example embodiment, there is provided a scan chain circuit which may include a plurality of flip-flops. Here, the flip-flops may be serially connected to transfer data stored in a first flip-flop to a second flip-flop according to a first control signal, the first flip-flop may be configured to store the data according to a second control signal, and the second control signal may be delayed by a predetermined time with respect to the first control signal.

According to still another example embodiment, there is provided an integrated circuit which may include a scan chain circuit. The scan chain circuit may include first through N-th flip-flops connected in series to sequentially transfer data in response to a control signal, where N is an integer greater than 1. In the first through N-th flip-flops, the data are transferred in a first direction from the first flip-flop to the N-th flip-flop, and the control signal is applied to the first through N-th flip-flops in a second direction opposite to the first direction from the N-th flip-flop to the first flip-flop.

BRIEF DESCRIPTION OF THE DRAWINGS

Illustrative, non-limiting example embodiments will be more clearly understood from the following detailed description taken in conjunction with the accompanying drawings, in which.

DETAILED DESCRIPTION OF THE EXAMPLE EMBODIMENTS

Figure 1:
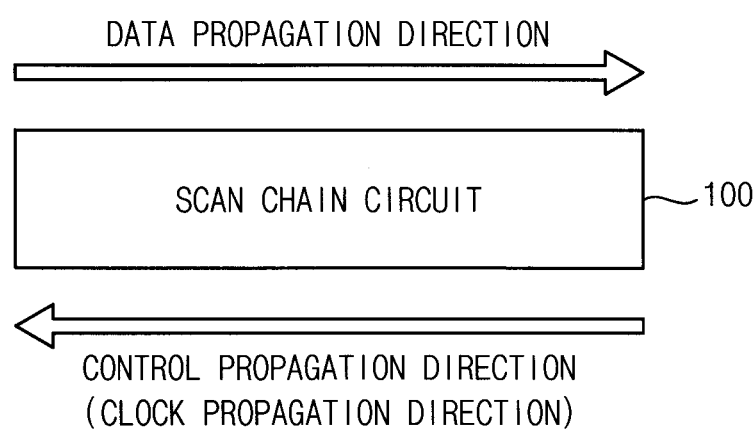
FIG. 1 is a block diagram illustrating a scan chain circuit according to an example embodiment.

Various example embodiments will be described more fully hereinafter with reference to the accompanying drawings. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a scan chain circuit according to an example embodiment.

Referring to FIG. 1, a control propagation direction of a scan chain circuit 100 according to an example embodiment may be opposite to a data propagation direction of the scan chain circuit 100.

The scan chain circuit 100 may include first through N-th flip-flops connected in series, where N is an integer greater than 1. The first through N-th flip-flops may sequentially transfer data in response to a control signal. In the first through N-th flip-flops, the data may be transferred in a first direction from the first flip-flop to the N-th flip-flop, and the control signal may be applied to the first through N-th flip-flops in a second direction opposite to the first direction from the N-th flip-flop to the first flip-flop.

Here, that the data are transferred in the first direction from the first flip-flop to the N-th flip-flop may mean that the data are input to the first flip-flop, are sequentially shifted by the first through N-th flip-flops, and are output from the N-th flip-flop. For example, the data output from the first flip-flop may be input to the second flip-flop, and the data output from the second flip-flop may be input the third flip-flop. That is, the data output from a previous flip-flop may be output to a current flip-flop, and the data output from the current flip-flop may be input to a next current flip-flop. Further, the data output from the (N−1)-th flip-flop may be input to the N-th flip-flop, and the N-th flip-flop may output the data to a circuit external to the scan chain circuit 100.

Further, here, that the control signal is applied in the second direction opposite from the N-th flip-flop to the first flip-flop may mean that the control signal is sequentially applied first to the N-th flip-flop and last to the first flip-flop such that the control signal is applied to the current flip-flop, and then is applied to the previous flip-flop (i.e., the flip-flop being previous to the current flip-flop on the basis of the data propagation direction). For example, the control signal may be first applied to the N-th flip-flop, and then may be applied to the (N−1)-th flip-flop that is previous to the N-th flip-flop. Similarly, after the control signal is applied to the second flip-flop, the control signal may be applied to the first flip-flop. To apply the control signal in the second direction, a length of a control signal line from a control signal input terminal of the scan chain circuit 100 to the N-th flip-flop may be the shortest, and a length of a control signal line from the control signal input terminal to the first flip-flop may be the longest. Thus, the control signal applied to the N-th flip-flop may pass through the shortest portion of a main control signal line of the scan chain circuit 100, and the control signal applied to the first flip-flop may pass through the longest portion of the main control signal line of the scan chain circuit 100. Accordingly, the control signal applied to an (M−1)-th flip-flop of the first through N-th flip-flops may be delayed (or lag) with respect to the control signal applied to an M-th flip-flop of the first through N-th flip-flops, where M is an integer greater than 1 and less than or equal to N.

According to an example embodiment, the control signal may be a clock signal, and a clock propagation direction of the scan chain circuit may be the second direction opposite to the first direction in which the data are transferred. Thus, the clock signal applied to the (M−1)-th flip-flop may be delayed (or lag) with respect to the clock signal applied to the M-th flip-flop. In a case where a clock signal applied to a current flip-flop is delayed by a long rising or falling transition time, an on-chip variation by a threshold voltage mismatch, an RC delay, etc. with respect to the clock signal applied to a previous flip-flop, a timing fail may occur in a related art scan chain circuit. That is, in the related art scan chain circuit, the current flip-flop may undesirably stores data at the same time when the previous flip-flop stores the data. However, in the scan chain circuit 100 according to the present example embodiment, since the clock signal is applied to the previous flip-flop after the clock signal is applied to the current flip-flop, the timing fail, by which the previous and current flip-flops simultaneously store data, may be prevented.

As described above, in the scan chain circuit 100 according to the present example embodiment, the control propagation direction (or the clock propagation direction) may be opposite to the data propagation direction, and thus the timing fail, by which inaccurate data are stored by the operation timing error of the flip-flops, may be prevented, thereby improving operation stability of the scan chain circuit 100.

Figure 2:
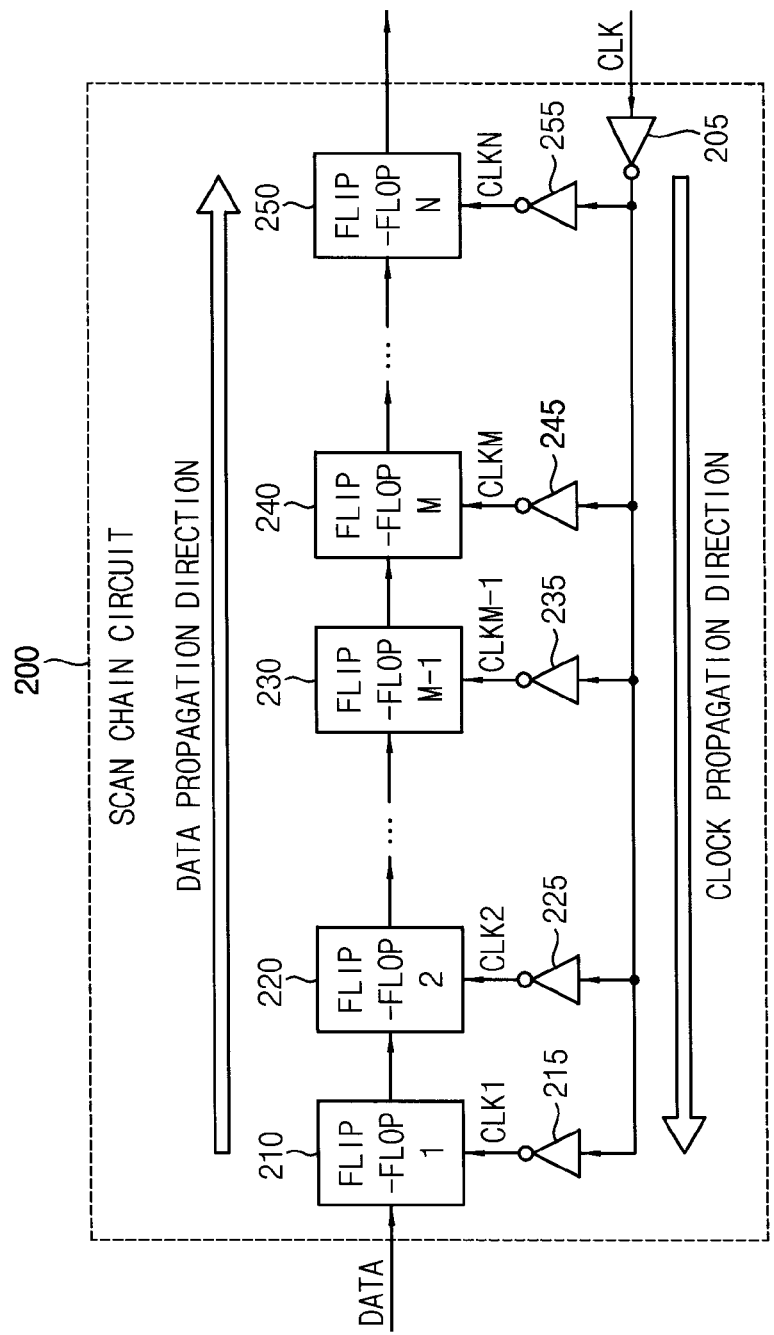
FIG. 2 is a block diagram illustrating a scan chain circuit according to an example embodiment.
Figure 3:
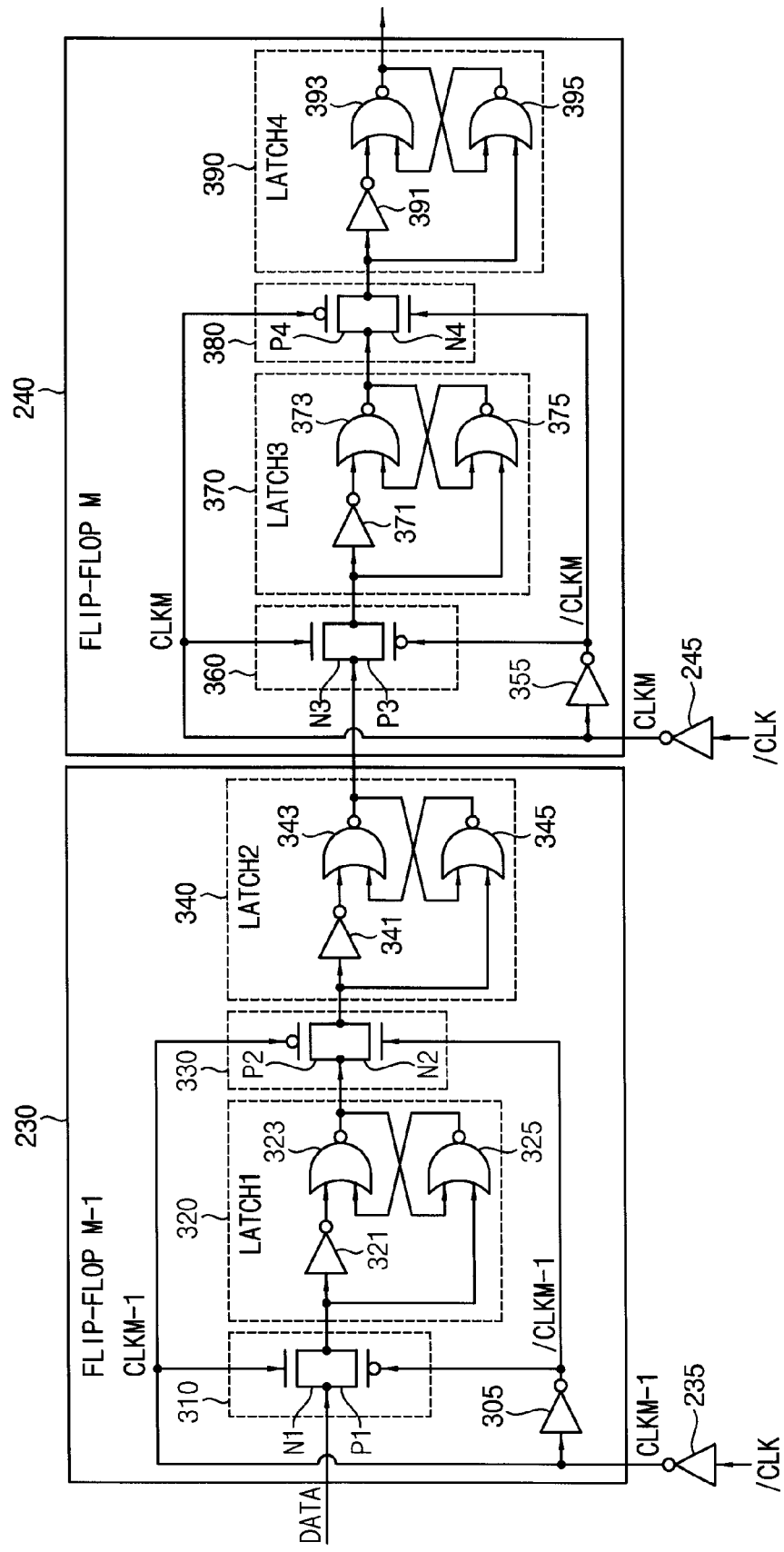
FIG. 3 is a circuit diagram illustrating two adjacent flip-flops included in a scan chain circuit of FIG. 2 according to an example embodiment.
Figure 4A:
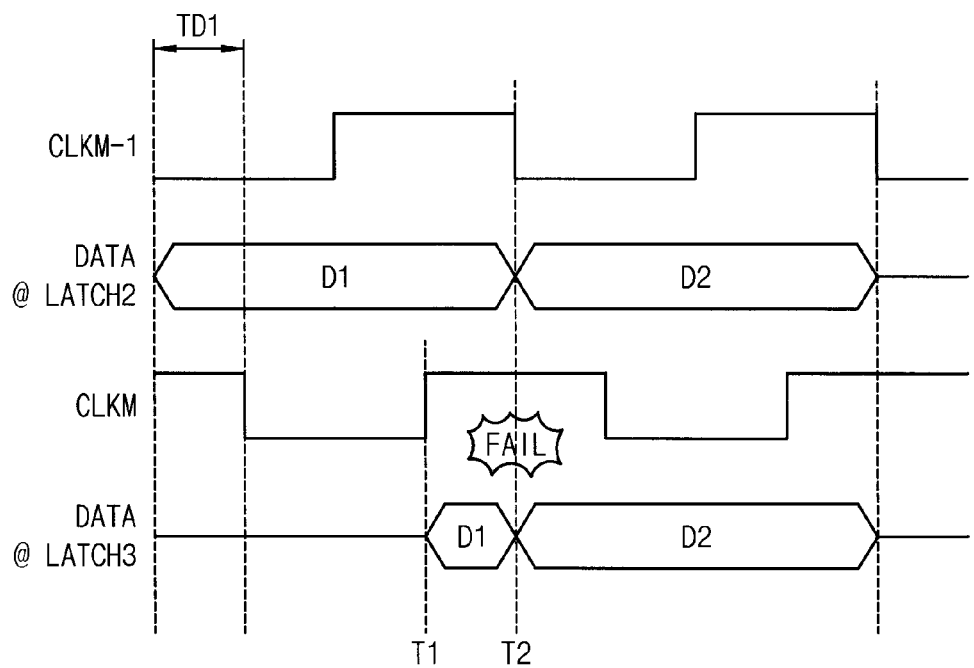
FIG. 4A is a timing diagram for describing operations of flip-flops of FIG. 3 when a clock propagation direction is the same as a data propagation direction.
Figure 4B:
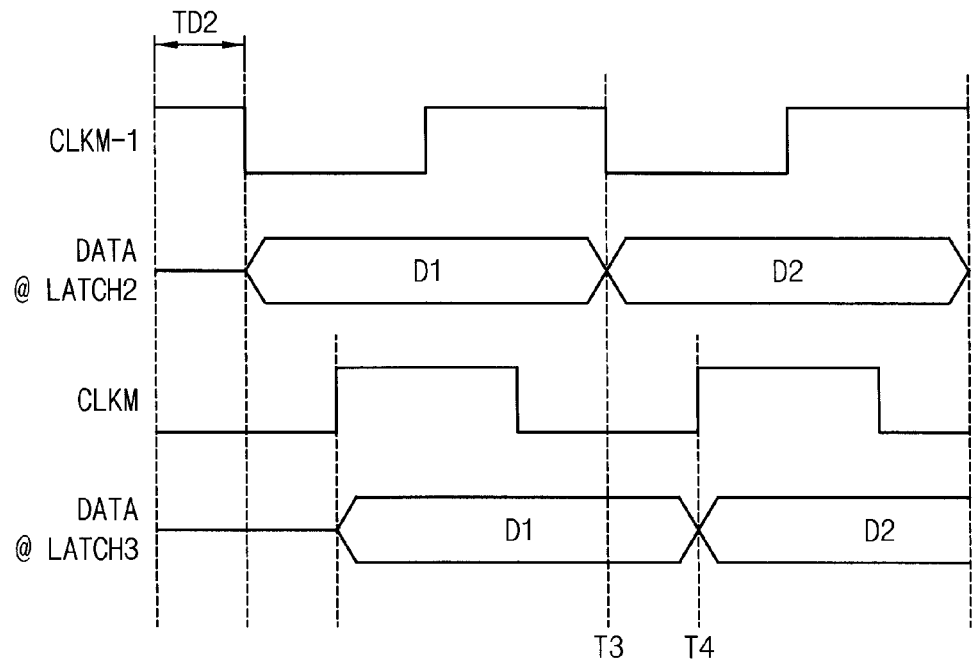
FIG. 4B is a timing diagram for describing operations of flip-flops of FIG. 3 when a clock propagation direction is opposite to a data propagation direction.

FIG. 2 is a block diagram illustrating a scan chain circuit according to an example embodiment, FIG. 3 is a circuit diagram illustrating two adjacent flip-flops included in a scan chain circuit of FIG. 2, FIG. 4A is a timing diagram for describing operations of flip-flops of FIG. 3 when a clock propagation direction is the same as a data propagation direction, and FIG. 4B is a timing diagram for describing operations of flip-flops of FIG. 3 when a clock propagation direction is opposite to a data propagation direction.

Referring to FIG. 2, a scan chain circuit 200 includes first through N-th flip-flops 210, 220, 230, 240 and 250 that are coupled in series. A data propagation direction of the scan chain circuit 200 may be a first direction from the first flip-flop 210 to the N-th flip-flop 250, and a clock propagation direction of the scan chain circuit 200 may be a second direction opposite to the first direction from the N-th flip-flop 250 to the first flip-flop 210.

The first through N-th flip-flops 210, 220, 230, 240 and 250 may sequentially transfer or shift data in response to a clock signal CLK. For example, data input from an external circuit may be stored in the first flip-flop 210 at a first cycle of the clock signal CLK, may be stored in the second flip-flop 220 at a second cycle of the clock signal CLK, and may be stored in the N-th flip-flop 250 at an N-th cycle of the clock signal CLK.

The clock signal CLK may be applied to the first through N-th flip-flops 210, 220, 230, 240 and 250 in the second direction from the N-th flip-flop 250 to the first flip-flop 210. Thus, the clock signal CLK may be sequentially applied such that, after the clock signal CLK is applied to a current flip-flop, the clock signal CLK is applied to a previous flip-flop. Accordingly, the clock signal CLKM−1 applied to the (M−1)-th flip-flop 230 may be delayed (or lag) with respect to clock signal CLKM applied to the M-th flip-flop 240, where M is an integer greater than 1 and less than or equal to N.

According to an example embodiment, the scan chain circuit 200 may further include at least one buffer or inverter for maintaining a signal level of the clock signal CLK or for preventing distortion of the clock signal CLK. For example, the scan chain circuit 200 may further include an input inverter 205 that outputs an inverted clock signal /CLK by inverting the control signal CLK received from an external circuit, and first through N-th inverters 215, 225, 235, 245 and 255 coupled to the first through N-th flip-flops 210, 220, 230, 240 and 250, respectively. Each of the first through N-th inverters 215, 225, 235, 245 and 255 may invert the inverted control signal /CLK, and the first through N-th inverters 215, 225, 235, 245 and 255 may apply first though N-th clock signal CLK1, CLK2, CLKM−1, CLKM and CLKM to the first through N-th flip-flops 210, 220, 230, 240 and 250.

In the scan chain circuit 200 according to the present example embodiment, since the clock propagation direction is the second direction from the N-th flip-flop 250 to the first flip-flop 210, the N-th inverter 255 may be coupled to a main clock signal line of the scan chain circuit 200 at a position closest to the input inverter 205, the (N−1)-th inverter 245 may be coupled to the main clock signal line at a position second closest to the input inverter 205, and the first inverter 215 may be coupled to the main clock signal line at a position farthest from the input inverter 205. Thus, a position at which the (M−1)-th inverter 235 is coupled to the main clock signal line may be farther from the input inverter 205 than a position at which the M-th inverter 235 is coupled to the main clock signal line. Accordingly, the (M−1)-th clock signal CLKM−1 output from the (M−1)-th inverter 235 to the (M−1)-th flip-flop 230 may be delayed (or lag) with respect to M-th clock signal CLKM applied to the M-th flip-flop 240. Since the M-th clock signal CLKM lags the (M−1)-th clock signal CLKM−1, the timing fail, by which inaccurate data are stored by the operation timing error, may be prevented. This timing fail prevention in the scan chain circuit 200 according to an example embodiment may be described below with reference to FIGS. 3 through 4B.

According to an example embodiment, as illustrated in FIG. 3, each flip-flops 230 and 240 may include two transmission gates 310, 330, 360 and 380 and two latches 320, 340, 370 and 390.

For example, the (M−1)-th flip-flop 230 may include a first transmission gate 310 that selectively transfers data DATA in response to the (M−1)-th clock signal CLKM−1, a first latch 320 that stores the data DATA transferred by the first transmission gate 310, a second transmission gate 330 that selectively transfers the data DATA stored in the first latch 320 in response to an (M−1)-th inverted clock signal /CLKM−1 (or an inversion signal of the (M−1)-th clock signal CLKM−1), and a second latch 340 that stores the data DATA transferred by the second transmission gate 330. An inverter 305 located inside or outside the (M−1)-th flip-flop 230 may generate the (M−1)-th inverted clock signal /CLKM−1 by inverting the (M−1)-th clock signal CLKM−1 output from the (M−1)-th inverter 235. Here, the first and second latches 320, 340 may be a set-reset (SR) latch, according to an example embodiment.

The M-th flip-flop 240 may include a third transmission gate 360 that selectively transfers data DATA output from the (M−1)-th flip-flop 230 in response to the M-th clock signal CLKM, a third latch 370 that stores the data DATA transferred by the third transmission gate 360, a fourth transmission gate 380 that selectively transfers the data DATA stored in the third latch 370 in response to an M-th inverted clock signal /CLKM (or an inversion signal of the M-th clock signal CLKM), and a fourth latch 390 that stores the data DATA transferred by the fourth transmission gate 380. An inverter 355 located inside or outside the M-th flip-flop 240 may generate the M-th inverted clock signal /CLKM by inverting the M-th clock signal CLKM output from the M-th inverter 245.

The first transmission gate 310 may include a first n-channel metal-oxide-semiconductor field-effect transistor (NMOS) transistor N1 coupled between an input terminal of the (M−1)-th flip-flop 230 and the first latch 320, and a first p-channel metal-oxide-semiconductor field-effect transistor (PMOS) transistor P1 coupled in parallel with the first NMOS transistor N1 between the input terminal of the (M−1)-th flip-flop 230 and the first latch 230. The first NMOS transistor N1 may have a gate receiving the (M−1)-th clock signal CLKM−1, and the first PMOS transistor P1 may have a gate receiving the (M−1)-th inverted clock signal /CLKM−1. When the (M−1)-th clock signal CLKM−1 has a logic high level, or when the (M−1)-th inverted clock signal /CLKM−1 has a logic low level, the first NMOS transistor N1 and the first PMOS transistor P1 may be turned on to transfer the data DATA to the first latch 320.

The first latch 320 may include an inverter 321 that inverts the data DATA transferred by the first transmission gate 310, a first logic gate 323 (e.g., a NOR gate or a NAND gate) having a first input terminal receiving an output signal of the inverter 321, a second input terminal, and an output terminal coupled to the second transmission gate 330, and a second logic gate 325 (e.g., a NOR gate or a NAND gate) having a first input terminal receiving the data DATA transferred by the first transmission gate 310, a second input terminal coupled to the output terminal of the first logic gate 323, and an output terminal coupled to the second input terminal of the first logic gate 323. For example, when the data transferred by the first transmission gate 310 have a value of "1", the data having the value of "1" may be applied to the first input terminal of the second logic gate 325, and the second logic gate 325 may output an output signal having a value of "0". An output signal of the inverter 321 having the value of "0" may be applied to the first input terminal of the first logic gate 323, the output signal of the second logic gate 325 having the value of "0" may be applied to the second input terminal of the first logic gate 323, and thus the first logic gate 323 may output an output signal having the value of "1". Since an output signal of each of the first and second logic gates 323 and 325 is input to another one of the first and second logic gates 323 and 325, the data DATA stored in the first latch 320 may be maintained.

The second transmission gate 330 may include a second PMOS transistor P2 coupled between the first latch 320 and the second latch 340, and a second NMOS transistor N2 coupled in parallel with the second PMOS transistor P2 between the first latch 320 and the second latch 330. The second PMOS transistor P2 may have a gate receiving the (M−1)-th clock signal CLKM−1, and the second NMOS transistor N2 having a gate receiving the (M−1)-th inverted clock signal /CLKM−1. When the (M−1)-th clock signal CLKM−1 has the logic low level, or when the (M−1)-th inverted clock signal /CLKM−1 has the logic high level, the second PMOS transistor P2 and the second NMOS transistor N2 may be turned on to transfer the data DATA stored in the first latch 320 to the second latch 340.

The second latch 340 may include an inverter 341 that inverts the data DATA transferred by the second transmission gate 330, a third logic gate 343 (e.g., a NOR gate or a NAND gate) having a first input terminal receiving an output signal of the inverter 341, a second input terminal, and an output terminal coupled to an input terminal of the M-th flip-flop 240, and a fourth logic gate 345 (e.g., a NOR gate or a NAND gate) having a first input terminal receiving the data DATA transferred by the second transmission gate 330, a second input terminal coupled to the output terminal of the third logic gate 343, and an output terminal coupled to the second input terminal of the third logic gate 343. Since an output signal of each of the third and fourth logic gates 343 and 345 is input to another one of the third and fourth logic gates 343 and 345, the data DATA stored in the second latch 340 may be maintained. In this configuration, the (M−1)-th flip-flop 230 may store the data DATA input to the (M−1)-th flip-flop at each cycle of the (M−1)-th clock signal CLKM−1.

Similarly, the third transmission gate 360 may include a third NMOS transistor N3 and a third PMOS transistor P3, the third latch 370 may include an inverter 371 and two logic gates 373 and 375, the fourth transmission gate 380 may include a fourth PMOS transistor P4 and a fourth NMOS transistor N4, and the fourth latch 390 may include an inverter 391 and two logic gates 393 and 395. In this configuration, the M-th flip-flop 240 may store the data DATA output from the (M−1)-th flip-flop 230 at each cycle of the M-th clock signal CLKM.

In a case where no time difference (or no phase difference) exists between the (M−1)-th clock signal CLKM−1 and the M-th clock signal CLKM, or in a case where the (M−1)-th clock signal CLKM−1 and the M-th clock signal CLKM are the same as the clock signal CLK, the data DATA input to the (M−1)-th flip-flop 230 may be stored in the first latch 320 of the (M−1)-th flip-flop 230 when the clock signal CLK has the logic high level. Thereafter, when the clock signal CLK transitions to the logic low level, the data DATA may be stored in the second latch 340 of the (M−1)-th flip-flop 230. Subsequently, when the clock signal CLK transitions to the logic high level, the data DATA may be stored in the third latch 370 of the M-th flip-flop 240. Subsequently, when the clock signal CLK transitions again to the logic low level, the data DATA may be stored in the fourth latch 390 of the M-th flip-flop 240. That is, the data DATA may be shifted and sequentially stored in the first through N-th flip-flops 210, 220, 230, 240 and 250. However, in a case where the M-th clock signal CLKM is delayed by more than a predetermined time with respect to the (M−1)-th clock signal CLKM−1, the timing fail by which inaccurate data are stored may occur.

For example, as illustrated in FIG. 4A, the second latch 340 of the (M−1)-th flip-flop 230 may store first data D1 output from the first latch 320 when the (M−1)-th clock signal CLKM−1 has the logic low level, and may maintain the stored first data D1 when the (M−1)-th clock signal CLKM−1 has the logic high level. The third latch 370 of the M-th flip-flop 240 may store the first data D1 from the second latch 340 at a time point T1 when the M-th clock signal CLKM transitions to the logic high level, and should maintain the first data D1 until the M-th clock signal CLKM transitions to the logic low level. However, in a case where the M-th clock signal CLKM is delayed by a time difference TD1 with respect to the (M−1)-th clock signal CLKM−1, the third latch 370 may not store and maintain the first data D1.

That is, the (M−1)-th clock signal CLKM−1 may transition to the logic low level while the M-th clock signal CLKM has the logic high level, and, at a time point when the (M−1)-th clock signal CLKM−1 may transition to the logic low level, second data D2 may be stored not only in the second latch 340 but also undesirably in the third latch 370. Thus, the timing fail, by which the second data D2 are undesirably stored instead of the first data D1 in the third latch 370, may occur.

However, in the scan chain circuit 200 according to the present example embodiment, the (M−1)-th clock signal CLKM−1 and the M-th clock signal CLKM may not substantially have the time difference, or the (M−1)-th clock signal CLKM−1 may be delayed with respect to the M-th clock signal CLKM, which prevents the timing fail. For example, as illustrated in FIG. 4B, if the (M−1)-th clock signal CLKM−1 and the M-th clock signal CLKM may have a time difference TD2, or if the (M−1)-th clock signal CLKM−1 is delayed by the time difference TD2 with respect to the M-th clock signal CLKM, the third latch 370 may maintain the first data at a time point T3 when the second latch 340 starts to store the second data D2. Thus, the third latch 370 may maintain the first data during one cycle of the M-th clock signal CLKM. Thereafter, at a time point T4 when the M-th clock signal CLKM transitions to the logic high level, the third latch 370 may store the second data D2.

As described above, in the scan chain circuit 200 according to the present example embodiment may have the control propagation direction (or the clock propagation direction) opposite to the data propagation direction, thereby preventing the timing fail, by which inaccurate data are stored by the operation timing error of the flip-flops, and improving operation stability of the scan chain circuit 200.

Although FIG. 3 illustrates an example of a configuration of each flip-flops 230 and 240, the configuration of each flip-flops 230 and 240 may not be limited thereto.

Figure 5:
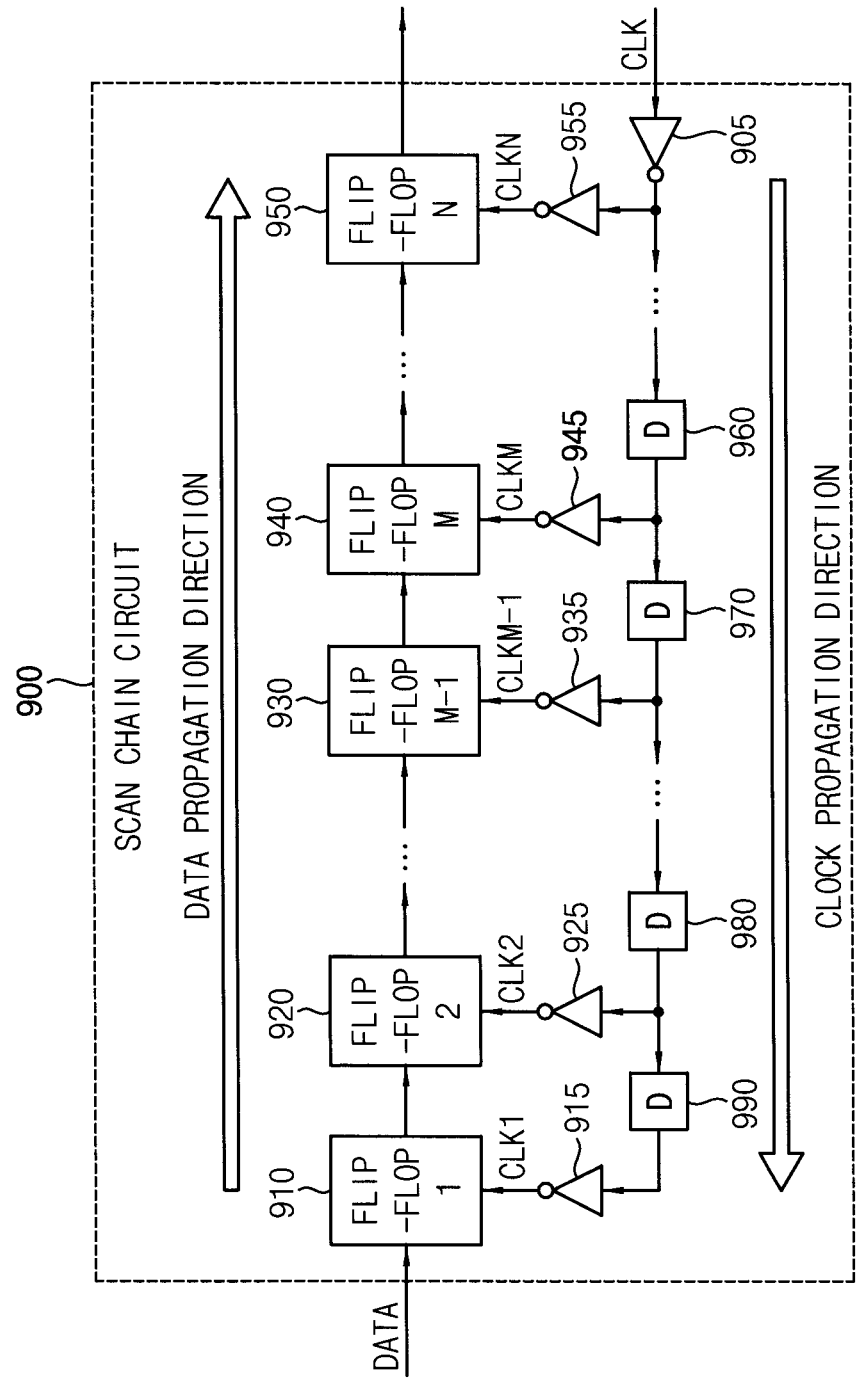
FIG. 5 is a block diagram illustrating a scan chain circuit according to an example embodiment.
Figure 6A:
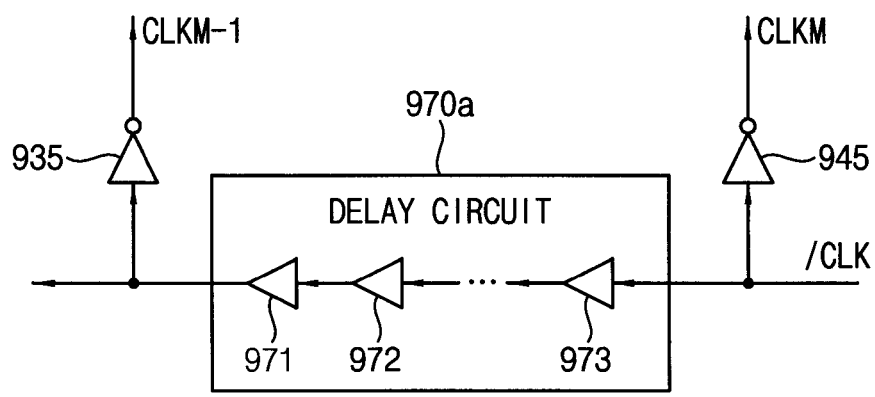
FIG. 6A is a block diagram illustrating an example of a delay circuit included in a scan chain circuit of FIG. 5.
Figure 6B:
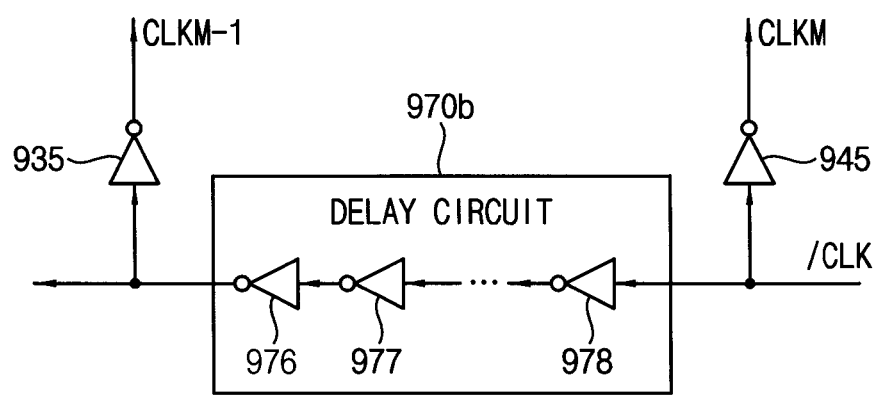
FIG. 6B is a block diagram illustrating another example of a delay unit included in a scan chain circuit of FIG. 5.

FIG. 5 is a block diagram illustrating a scan chain circuit according to another example embodiment, FIG. 6A is a block diagram illustrating an example of a delay circuit included in a scan chain circuit of FIG. 5, and FIG. 6B is a block diagram illustrating another example of a delay circuit included in a scan chain circuit of FIG. 5.

Referring to FIG. 5, a scan chain circuit 900 includes first through N-th flip-flops 910, 920, 930, 940 and 950 that are coupled in series. According to an example embodiment, the scan chain circuit 900 may further include an input inverter 905 and first through N-th inverters 915, 925, 936, 945 and 955. A data propagation direction of the scan chain circuit 900 may be a first direction from the first flip-flop 910 to the N-th flip-flop 950, and a clock propagation direction of the scan chain circuit 900 may be a second direction opposite to the first direction from the N-th flip-flop 950 to the first flip-flop 910. The scan chain circuit 900 of FIG. 5 may have a similar configuration to a scan chain circuit 200 of FIG. 2, except that the scan chain circuit 900 of FIG. 5 further includes at least one delay circuit 960, 970, 980 and 990.

The scan chain circuit 900 may further include at least one delay circuit 960, 970, 980 and 990. According to an example embodiment, the scan chain circuit 900 may further include first through (N−1)-th delay circuits 960, 970, 980 and 990. Each of the first through (N−1)-th delay circuits 960, 970, 980 and 990 may be coupled between input terminals of two adjacent inverters of the first through N-th inverters 915, 925, 936, 945 and 955. For example, an (M−1)-th delay circuit 970 may be located between a position at which an (M−1)-th inverter 935 is coupled to a main clock signal line and a position at which an M-th inverter 945 is coupled to the main clock signal line such that an (M−1)-th clock signal CLKM−1 applied to an (M−1)-th flip-flop 930 is delayed with respect to an M-th clock signal CLKM applied to an M-th flip-flop 940.

According to the present example embodiment, each of the first through (N−1)-th delay circuits 960, 970, 980 and 990 may include at least one buffer, at least one inverter, and/or other delay elements. For example, as illustrated in FIG. 6A, the (M−1)-th delay circuit 970a located between the position at which the (M−1)-th inverter 935 is coupled to the main clock signal line and the position at which the M-th inverter 945 is coupled to the main clock signal line may include at least one buffer 971, 972 and 973 to delay the (M−1)-th clock signal CLKM−1. In another example, as illustrated in FIG. 6B, the (M−1)-th delay circuit 970a located between the position at which the (M−1)-th inverter 935 is coupled to the main clock signal line and the position at which the M-th inverter 945 is coupled to the main clock signal line may include at least one inverter 976, 977 and 978 to delay the (M−1)-th clock signal CLKM−1. Since the (M−1)-th inverter 935 includes the buffer 971, 972 and 973, the inverter 976, 977 and 978, and/or other delay elements to delay the (M−1)-th clock signal CLKM−1, it may be ensured that the (M−1)-th clock signal CLKM−1 lags the M-th clock signal CLKM, which results in the prevention of the timing fail.

As described above, the scan chain circuit 900 according to example embodiments may have the control propagation direction (or the clock propagation direction) opposite to the data propagation direction, thereby preventing the timing fail by which inaccurate data are stored by the operation timing error of the flip-flops and improving operation stability of the scan chain circuit 900. Further, the scan chain circuit 900 according to example embodiments may include at least one delay circuit to ensure than a clock signal applied to a previous flip-flop lags a clock signal applied to a current flip-flop, and thus the timing fail may be more reliably prevented.

Figure 7:
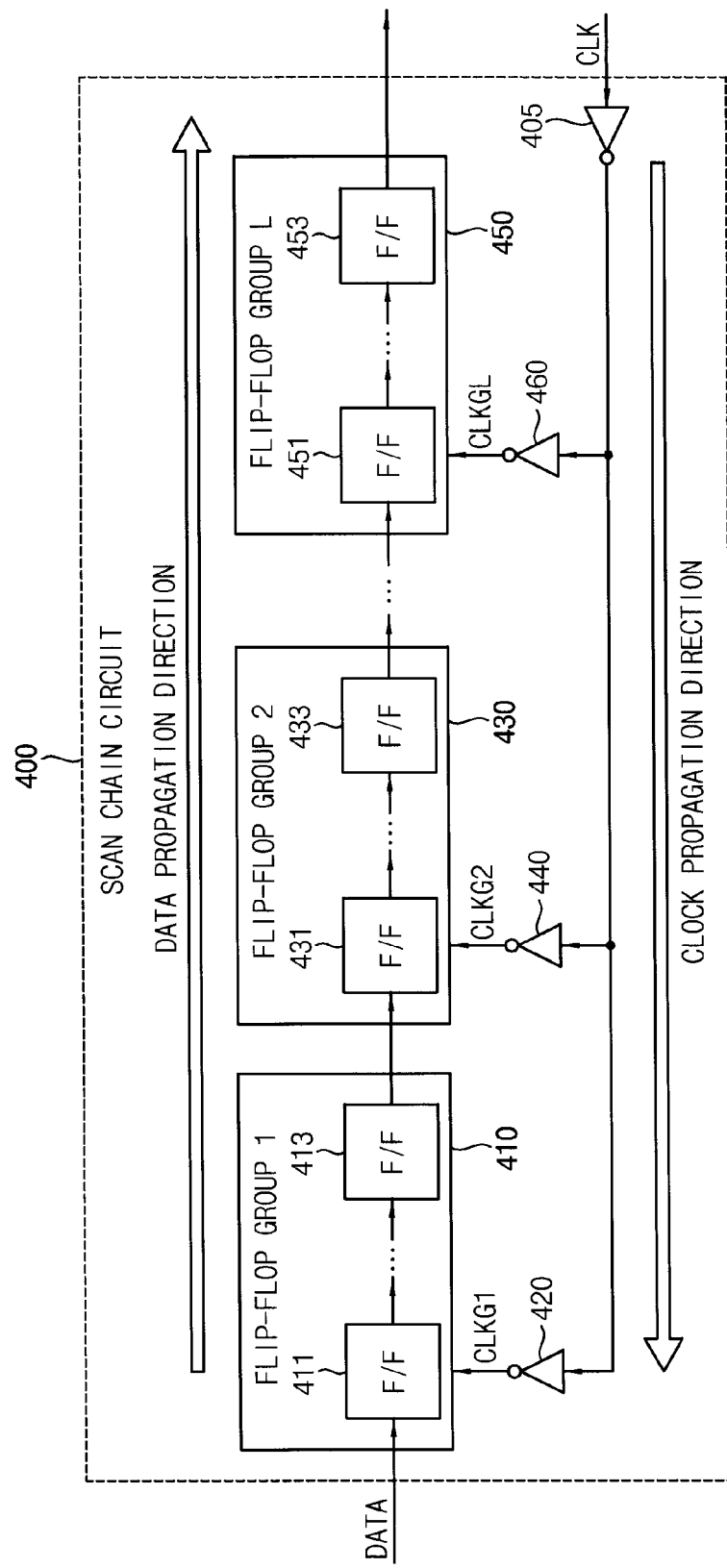
FIG. 7 is a block diagram illustrating a scan chain circuit according to an example embodiment.

FIG. 7 is a block diagram illustrating a scan chain circuit according to an example embodiment.

Referring to FIG. 7, a scan chain circuit 400 includes a plurality of flip-flops 411, 413, 431, 433, 451 and 453 that are coupled in series. According to the present example embodiment, the scan chain circuit 400 may further include an input inverter 405 and first through L-th inverters 420, 440 and 460. In the scan chain circuit 400 of FIG. 7, the plurality of flip-flops 411, 413, 431, 433, 451 and 453 may be grouped into a plurality of flip-flop groups 410, 430 and 450, and the flip-flops 411, 413, 431, 433, 451 and 453 in the same flip-flop group 410, 430 and 450 may receive a clock signal CLK at substantially the same time.

The plurality of flip-flops 411, 413, 431, 433, 451 and 453 may be grouped into first through L-th flip-flop groups 410, 430 and 450, where L is greater than 1, and the flip-flops 411, 413, 431, 433, 451 and 453 in the same flip-flop group 410, 430 and 450 may substantially simultaneously receive the clock signal CLK. For example, the clock signal CLK may be applied from a main clock signal line to each flip-flop group 410, 430 and 450 through one branch clock signal line per flip-flop group, and the flip-flops 411, 413, 431, 433, 451 and 453 in the same flip-flop group 410, 430 and 450 may receive the clock signal CLK through the same branch clock signal line. Thus, a first clock signal CLKG1 output from the first inverter 420 may be applied to the first flip-flop group 410, a second clock signal CLKG2 output from the second inverter 440 may be applied to the second flip-flop group 430, and an L-th clock signal CLKGL output from the L-th inverter 460 may be applied to the L-th flip-flop group 450. Since the flip-flops 411, 413, 431, 433, 451 and 453 in the same flip-flop group 410, 430 and 450 substantially simultaneously receive the clock signal CLK, a timing margin of the clock signal CLK considered in designing an integrated circuit or an intellectual property including the scan chain circuit 400 may be reduced, and a path of the clock signal CLK may not operate as a critical path that limits an operating speed of the integrated circuit or the intellectual property.

A clock propagation direction of the scan chain circuit 400 may be opposite to a data propagation direction. Thus, the control signal CLK applied to a (K−1)-th flip-flop group of the first through L-th flip-flop groups 410, 430 and 450 may be delayed with respect to the control signal applied to a K-th flip-flop group of the first through L-th flip-flop groups 410, 430 and 450, where K is an integer greater than 1 and less than or equal to L. In a case where a clock signal applied to a first flip-flop (e.g., 431) in a current flip-flop group (e.g., 430) is delayed by more than a predetermined time with respect to a clock signal applied to a last flip-flop (e.g., 413) in a previous flip-flop group (e.g., 410), a timing fail may occur. However, in the scan chain circuit 400 according to the present example embodiment, since the clock signal (e.g., CLKG1) applied to the previous flip-flop group (e.g., 410) is delayed with respect to the clock signal (e.g., CLKG2) applied to the current flip-flop group (e.g., 430), the timing fail may be prevented.

As described above, the scan chain circuit 400 according to the present example embodiment may have the control propagation direction (or the clock propagation direction) opposite to the data propagation direction, thereby preventing the timing fail by which inaccurate data are stored by the operation timing error of the flip-flops and improving operation stability of the scan chain circuit 400. Further, in the scan chain circuit 400 according to the present example embodiment, since the same clock signal CLK is applied to each flip-flop group, the timing margin of the clock signal CLK may be reduced, and the path of the clock signal CLK may not operate as the critical path.

Figure 8:
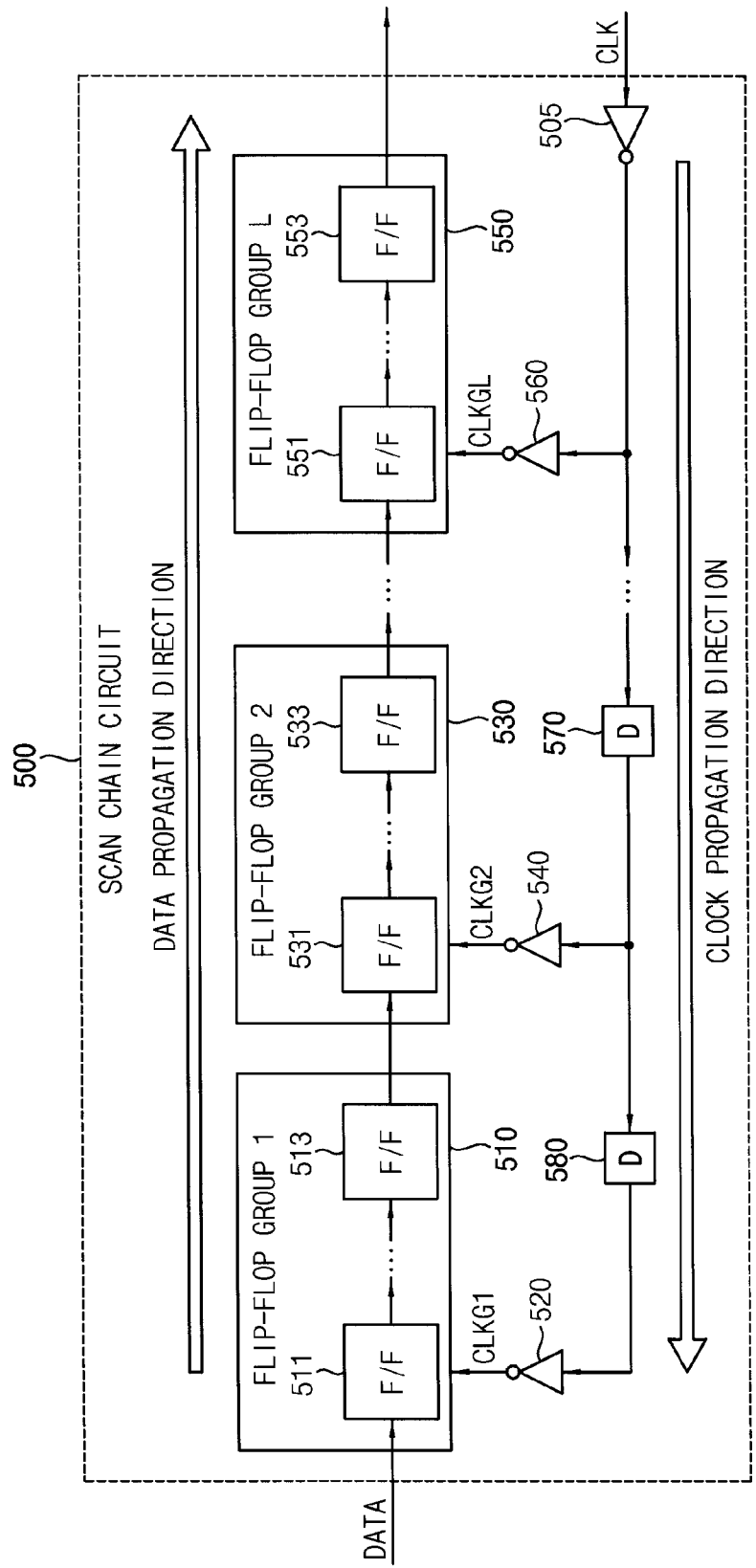
FIG. 8 is a block diagram illustrating a scan chain circuit according to an example embodiment.

FIG. 8 is a block diagram illustrating a scan chain circuit according to an example embodiment.

Referring to FIG. 8, a scan chain circuit 500 includes a plurality of flip-flops 511, 513, 531, 533, 551 and 553 that are coupled in series, and the plurality of flip-flops 511, 513, 531, 533, 551 and 553 may be grouped into first through L-th flip-flop groups 510, 530 and 550. According to an example embodiment, the scan chain circuit 500 may further include an input inverter 505 and first through L-th inverters 520, 540 and 560 that apply first through L-th clock signals CLKG1, CLKG2 and CLKGL to the first through L-th flip-flop groups 510, 530 and 550, respectively. A clock propagation direction of the scan chain circuit 500 may be opposite to a data propagation direction. The scan chain circuit 500 of FIG. 8 may have a similar configuration to a scan chain circuit 400 of FIG. 7, except that the scan chain circuit 500 of FIG. 8 further includes at least one delay circuit 570 and 580.

The scan chain circuit 500 may further include at least one delay circuit 570 and 580. According to an example embodiment, the scan chain circuit 500 may further include first through (L−1)-th delay circuits 570 and 580. Each of first through (L−1)-th delay circuits 570 and 580 may be coupled between input terminals of two adjacent inverters of the first through L-th inverters 520, 540 and 560. For example, a first delay circuit 580 may be located between a position at which the first inverter 520 is coupled to a main clock signal line and a position at which the second inverter 540 is coupled to the main clock signal line such that the first clock signal CLKG1 applied to the first flip-flop group 510 is delayed with respect to the second clock signal CLKG2 applied to the second flip-flop 530. According to an example embodiment, each of the first through (L−1)-th delay circuits 570 and 580 may include at least one buffer, at least one inverter, and/or other delay elements.

As described above, the scan chain circuit 500 according to example embodiments may have the control propagation direction (or the clock propagation direction) opposite to the data propagation direction, thereby preventing the timing fail by which inaccurate data are stored by the operation timing error of the flip-flops and improving operation stability of the scan chain circuit 500. Further, the scan chain circuit 500 according to the present example embodiment may include at least one delay circuit to ensure than a clock signal applied to a previous flip-flop group lags a clock signal applied to a current flip-flop group, and thus the timing fail may be more reliably prevented.

Figure 9:
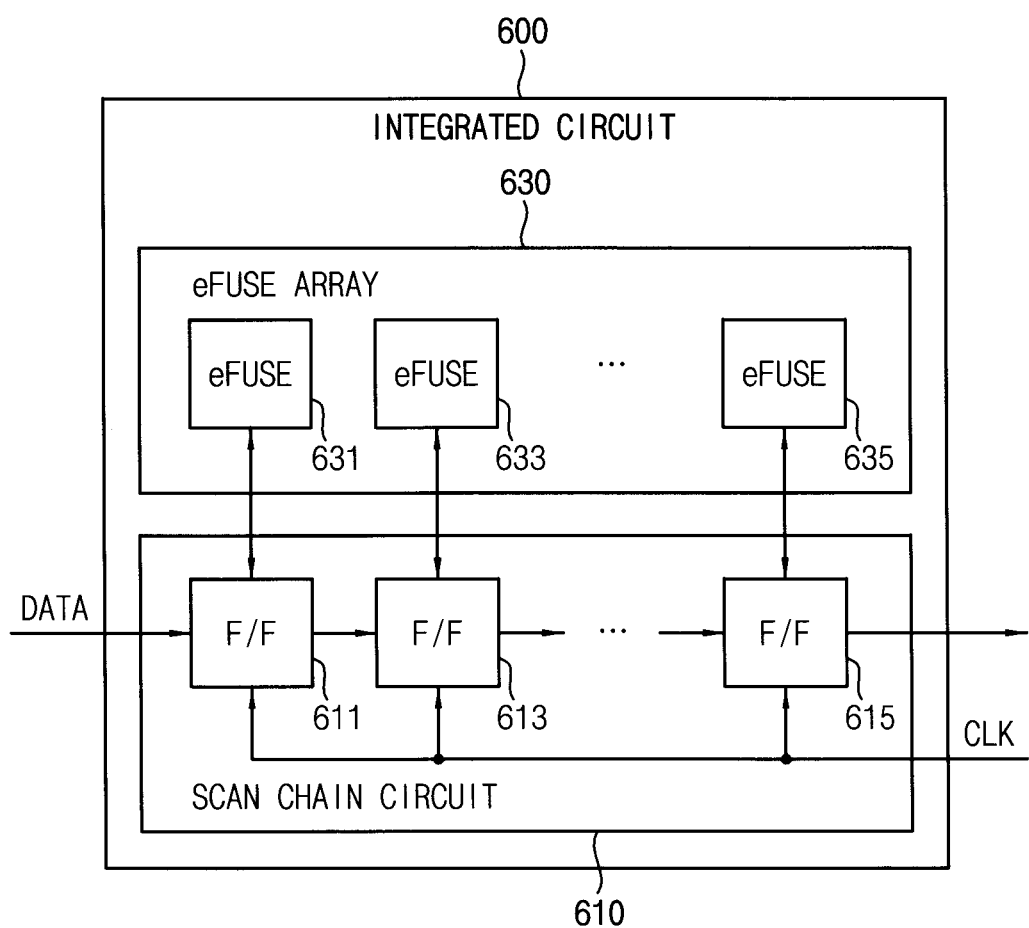
FIG. 9 is a block diagram illustrating an example of an integrated circuit including a scan chain circuit according to an example embodiment.

FIG. 9 is a block diagram illustrating an example of an integrated circuit including a scan chain circuit according to an example embodiment.

Referring to FIG. 9, an integrated circuit 600 may include a scan chain circuit 610 having a plurality of flip-flops 611, 613 and 615 that are connected in series. A control propagation direction (or a clock propagation direction) of the scan chain circuit 610 may be opposite to a data propagation direction. Accordingly, a timing fail, by which inaccurate data are stored by an operation timing error of flip-flops, may be prevented, and operation stability of the scan chain circuit 610 may be improved.

The integrated circuit 600 may further include an electrical fuse array 630 having a plurality of electrical fuse elements 631, 633 and 635. According to an example embodiment, the electrical fuse elements 631, 633 and 635 may be electrically programmed or blown by using the scan chain circuit 610. For example, data DATA to be programmed to the electrical fuse elements 631, 633 and 635 of the electrical fuse array 630 may be sequentially applied and stored in the scan chain circuit 610. The electrical fuse elements 631, 633 and 635 of the electrical fuse array 630 may be cut or uncut based on the data DATA stored in the flip-flops 611, 613 and 615 of the scan chain circuit 610, respectively. As described above, the scan chain circuit 610 may be used in programming the electrical fuse array 630. According to another example embodiment, data stored in the electrical fuse array 630 may be sensed by using the scan chain circuit 610. For example, the data stored in the electrical fuse elements 631, 633 and 635 of the electrical fuse array 630 may be read to the flip-flops 611, 613 and 615 of the scan chain circuit 610, and the data stored in the flip-flops 611, 613 and 615 of the scan chain circuit 610 may be sequentially output. As described above, the scan chain circuit 610 may be used in sensing the electrical fuse array 630. According to an example embodiment, the data stored in the electrical fuse array 630 may be an electronic chip ID (ECID) of the integrated circuit 600.

As described above, the integrated circuit 600 may include the scan chain circuit 610 for programming and/or sensing the electrical fuse array 630. The scan chain circuit 610 may have the control propagation direction (or the clock propagation direction) opposite to the data propagation direction, thereby preventing the timing fail and improving the operation stability.

According to an example embodiment, the integrated circuit 600 may be any integrated circuit, such as an electrical fuse (eFUSE) circuit, a processor, a memory, a microcontroller, a microprocessor, an application specific integrated circuit (ASIC), a system-on-chip (SOC), etc.

Figure 10:
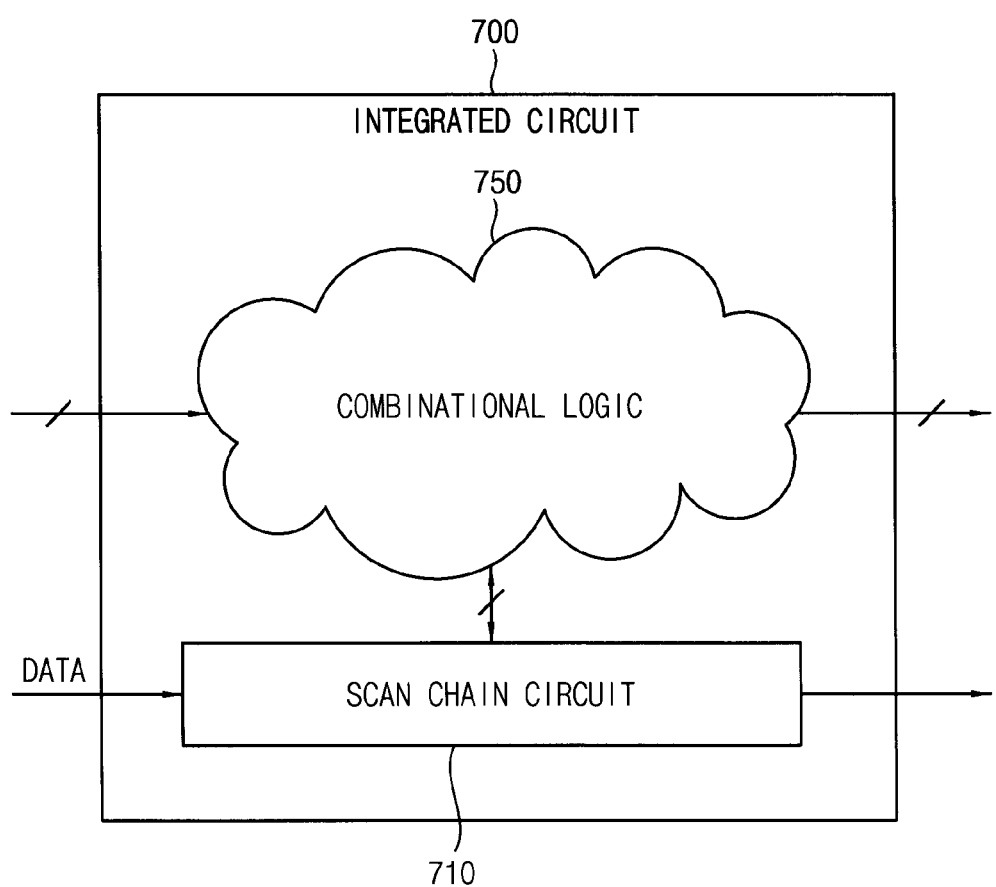
FIG. 10 is a block diagram illustrating another example of an integrated circuit including a scan chain circuit according to an example embodiment.

FIG. 10 is a block diagram illustrating another example of an integrated circuit including a scan chain circuit according to an example embodiment.

Referring to FIG. 10, an integrated circuit 700 may include a scan chain circuit 710 having a plurality of flip-flops that are connected in series. A control propagation direction (or a clock propagation direction) of the scan chain circuit 710 may be opposite to a data propagation direction. Accordingly, a timing fail, by which inaccurate data are stored by an operation timing error of flip-flops, may be prevented, and operation stability of the scan chain circuit 710 may be improved.

The integrated circuit 700 may further include a combinational logic circuit 750. According to an example embodiment, the scan chain circuit 710 may be used for a scan test for the combinational logic circuit 750. For example, a test pattern for the combinational logic circuit 750 may be sequentially applied and stored in the scan chain circuit 710 as data DATA of the scan chain circuit 710. The test pattern stored in the scan chain circuit 710 may be input to the combinational logic circuit 750, and then a process result of the combinational logic circuit 750 may be provided to the scan chain circuit 710. The process result stored in the scan chain circuit 710 may be sequentially output. As described above, the scan chain circuit 710 may be a design for test (DFT) circuit for efficiently testing the combinational logic circuit 750 or the integrated circuit 700.

As described above, the integrated circuit 700 may include the scan chain circuit 710 for performing the scan test for the combinational logic circuit 750 or the integrated circuit 700. The scan chain circuit 710 may have the control propagation direction (or the clock propagation direction) opposite to the data propagation direction, thereby preventing the timing fail and improving the operation stability.

Figure 11:
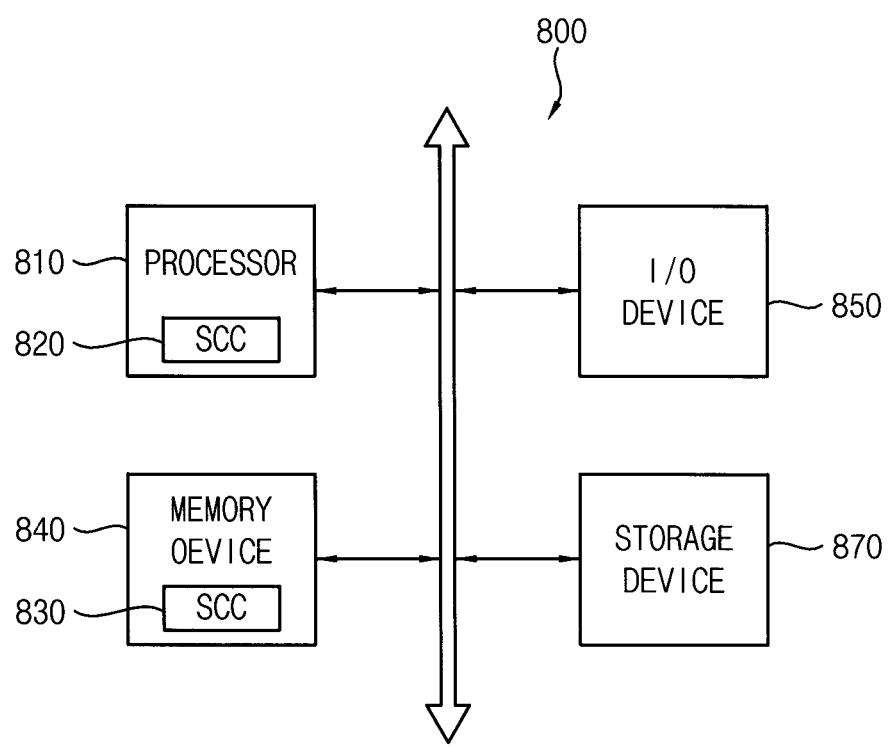
FIG. 11 is a block diagram illustrating an electronic device including a scan chain circuit according to an example embodiment.

FIG. 11 is a block diagram illustrating an electronic device including a scan chain circuit according to an example embodiment.

Referring to FIG. 11, an electronic device 800 includes a processor 810, a memory device 830, an input/output (I/O) device 7850 and a storage device 870. The electronic device 800 may further include a plurality of ports for communicating a video card, a sound card, a memory card, a universal serial bus (USB) device, other electronic systems, etc.

The processor 810 may perform various computing functions or tasks. The processor 810 may be for example, a microprocessor, a central processing unit (CPU), an application processor (AP), etc. According to an example embodiment, the processor 810 may include a scan chain circuit 820. For example, the scan chain circuit 820 may be used in programming or sensing an electrical fuse array, may be used for a scan test, or may be used as a shift register. The processor 810 may be connected to other components via an address bus, a control bus, a data bus, etc. Further, the processor 810 may be coupled to an extended bus such as a peripheral component interconnection (PCI) bus.

The memory device 840 may store data for operations of the electronic device 800. For example, the memory device 840 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc. According to an example embodiment, the memory device 840 may include a scan chain circuit 830. For example, the scan chain circuit 830 may be used in programming or sensing an electrical fuse array, may be used for a scan test, or may be used as a shift register. According to an example embodiment, the scan chain circuit 830 may be used in sensing an electrical fuse array that stores an address of cell to be replaced with a redundancy cell in the memory device 840.

The I/O device 850 may be, for example, an input device such as a keyboard, a keypad, a mouse, a touch screen, etc, and/or an output device such as a display device, a printer, a speaker, etc. The storage device 870 may be, for example, a solid state drive (SSD) device, a hard disk drive (HDD) device, a CD-ROM device, etc. According to an example embodiment, the electronic device 800 may further include a power supply that supplies power for operations of the electronic device 800, an image sensor, etc.

The electronic device 800 may be any electronic device, such as a cellular phone, a smart phone, a personal digital assistant (PDA), a portable multimedia player (PMP), a digital camera, a personal computer (PC), a sever computer, a workstation, a laptop computer, a digital television, a set-top box, a music player, a portable game console, a navigation system, etc.

The present inventive concept may be applied to any scan chain circuit, or any circuit, device, or integrated circuit including the scan chain circuit. For example, the present inventive concept may be applied to an electrical fuse (eFUSE) circuit, a processor, a memory, a microcontroller, a microprocessor, an application specific integrated circuit (ASIC), a system-on-chip (SOC), an intellectual property (IP), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A scan chain circuit comprising:
    first through N-th flip-flops connected in series to sequentially transfer data in response to a control signal, where N is an integer greater than 1,
    wherein, in the first through N-th flip-flops, the data are transferred in a first direction from the first flip-flop to the N-th flip-flop,
    wherein the control signal is applied to the first through N-th flip-flops in a second direction opposite to the first direction from the N-th flip-flop to the first flip-flop,
    wherein the first through N-th flip-flops are grouped into first through L-th flip-flop groups, where L is an integer greater than 1 and less than or equal to N, and
    wherein two or more flip-flops in a same flip-flop group among the first through L-th flip-flop groups receive the control signal at a substantially same time.

2. The scan chain circuit of claim 1, wherein the control signal applied to an (M−1)-th flip-flop group among the first through L-th flip-flop groups is delayed with respect to the control signal applied to an M-th flip-flop group of the first through L-th flip-flop groups, where M is an integer greater than 1 and less than or equal to N.

3. The scan chain circuit of claim 2, further comprising:
    a delay circuit configured to delay the control signal applied to the (M−1)-th flip-flop group such that the control signal applied to the (M−1)-th flip-flop group is delayed with respect to the control signal applied to the M-th flip-flop group.

4. The scan chain circuit of claim 1, wherein the control signal is a clock signal, and
    wherein a clock propagation direction of the scan chain circuit is the second direction opposite to the first direction in which the data are transferred.

5. The scan chain circuit of claim 1, further comprising:
    an input inverter configured to invert the control signal; and
    first through inverters coupled to the first through L-th flip-flop groups, respectively,
    wherein each of the first through L-th inverters is configured to invert the inverted control signal.

6. The scan chain circuit of claim 5, further comprising:
    first through (L−1)-th delay circuits each of which is coupled between input terminals of two adjacent inverters of the first through L-th inverters.

7. The scan chain circuit of claim 1, wherein at least one of the flip-flops comprises:
    a first transmission gate configured to selectively transfer the data in response to the control signal;
    a first latch configured to store the data transferred by the first transmission gate;
    a second transmission gate configured to selectively transfer the data stored in the first latch in response to an inversion signal of the control signal; and
    a second latch configured to store the data transferred by the second transmission gate.

8. The scan chain circuit of claim 7,
    wherein the first transmission gate comprises:
        a first n-channel metal-oxide-semiconductor field-effect transistor (NMOS) transistor coupled between an input terminal of a corresponding one of the first through N-th flip-flops and the first latch, the first NMOS transistor comprising a gate receiving the control signal; and
        a first p-channel metal-oxide-semiconductor field-effect transistor (PMOS) transistor coupled in parallel with the first NMOS transistor between the input terminal of the corresponding one of the first through N-th flip-flops and the first latch, the first PMOS transistor comprising a gate receiving the inversion signal of the control signal, and
    wherein the second transmission gate comprises:
        a second PMOS transistor coupled between the first latch and the second latch, the second PMOS transistor comprising a gate receiving the control signal; and
        a second NMOS transistor coupled in parallel with the second PMOS transistor between the first latch and the second latch, the second NMOS transistor comprising a gate receiving the inversion signal of the control signal.

9. The scan chain circuit of claim 7, wherein the first latch comprises:
a first inverter configured to invert the data transferred by the first transmission gate;
a first logic gate comprising a first input terminal receiving an output signal of the first inverter, a second input terminal, and an output terminal coupled to an output terminal of the second transmission gate; and
a second logic gate comprising a first input terminal receiving the data transferred by the first transmission gate, a second input terminal coupled to the output terminal of the first logic gate, and an output terminal coupled to the second input terminal of the first logic gate, and
wherein the second latch comprises:
a second inverter configured to invert the data transferred by the second transmission gate;
a third logic gate comprising a first input terminal receiving an output signal of the second inverter, a second input terminal, and an output terminal coupled to an input terminal of a next one of the first through N-th flip-flops; and
a fourth logic gate comprising a first input terminal receiving the data transferred by the second transmission gate, a second input terminal coupled to the output terminal of the third logic gate, and an output terminal coupled to the second input terminal of the third logic gate.

10. A scan chain circuit comprising a plurality of flip-flop groups,
wherein the flip-flop groups are serially connected to transfer data stored in a first flip-flop group to a second flip-flop group according to a first control signal,
wherein the first flip-flop group is configured to store the data according to a second control signal,
wherein the second control signal is delayed by a predetermined time with respect to the first control signal, and
wherein each of the flip-flop groups comprises a plurality of flip-flops which are serially connected to one another, and receive a control signal to store the data or transfer the data to a next flip-flop at a substantially same time.

11. The scan chain circuit of claim 10, wherein the first flip-flop group is configured to store the data from a rising or falling edge of the second control signal, and transfer the data to the second flip-flop group at a falling or rising edge of the first control signal, respectively.

12. The scan chain circuit of claim 10, wherein each of the first and second flip-flop groups comprises a set-reset (SR) latch.

13. The scan chain circuit of claim 10, wherein the first and second control signals are a same clock signal.

14. The scan chain circuit of claim 10, wherein the second flip-flop group is configured to store data previously transferred from the first flip-flop group during the predetermined time from a time point when the first flip-flop group begins to store the data.

15. An integrated circuit comprising a scan chain circuit, the scan chain circuit comprising:
first through N-th flip-flops connected in series to sequentially transfer data in response to a control signal, where N is an integer greater than 1,
wherein, in the first through N-th flip-flops, the data are transferred in a first direction from the first flip-flop to the N-th flip-flop,
wherein the control signal is applied to the first through N-th flip-flops in a second direction opposite to the first direction from the N-th flip-flop to the first flip-flop,
wherein the first N-th flip-flops are grouped into first through L-th flip-flop groups, where L is an integer greater than 1 and less than or equal to N, and
wherein two or more flip-flops in a same flip-flop group among the first through L-th flip-flop groups receive the control signal at a substantially same time.

* * * * *